United States Patent
Chiou et al.

[11] Patent Number: 5,883,012
[45] Date of Patent: Mar. 16, 1999

[54] METHOD OF ETCHING A TRENCH INTO A SEMICONDUCTOR SUBSTRATE

[75] Inventors: Herng-Der Chiou, Tempe; Ping-Chang Lue, Scottsdale, both of Ariz.

[73] Assignee: Motorola, Inc., Schaumburg, Ill.

[21] Appl. No.: 576,282

[22] Filed: Dec. 21, 1995

[51] Int. Cl.⁶ .................... H01L 21/302; H01L 21/306
[52] U.S. Cl. .................... 438/748; 216/41; 216/96; 216/99; 438/455; 438/456; 438/745; 438/749; 438/753; 438/756; 438/757; 438/705; 438/928; 438/973
[58] Field of Search ................ 216/41, 96, 99; 438/455, 456, 745, 748, 749, 753, 756, 757, 705, 928, 973, 121; 252/79.1, 79.2, 79.3, 79.4, 79.5; 437/947

[56] References Cited

U.S. PATENT DOCUMENTS

| | | | |
|---|---|---|---|
| 4,867,842 | 9/1989 | Bohrer et al. | 438/53 |
| 5,207,866 | 5/1993 | Lue et al. | 205/656 |
| 5,336,634 | 8/1994 | Katayama et al. | 438/406 |
| 5,484,507 | 1/1996 | Ames | 216/2 |
| 5,698,063 | 12/1997 | Ames | 156/345 |

FOREIGN PATENT DOCUMENTS

| | | | |
|---|---|---|---|
| 3215411 | 10/1983 | Germany | 216/41 |
| 60-070186 | 4/1985 | Japan | 216/41 |
| 9412886 | 6/1994 | WIPO . | |

OTHER PUBLICATIONS

Chemical Abstract No. 123:23883 which is an abstract of German Patent Specification No. 433466 (Dec. 1994).
Chemical Abstract No. 114:113301 which is an abstract of Japanese Patent Specification No. 02–246242 (Oct. 1990).
WPIDS Abstract No. 93:285817 which is an abstract of Japanese Patent Specification No. 05–203668 (Aug. 1993).
WPIDS Abstract No. 94:254544 which is an abstract of Soviet Union Patent Specification No. 795326 (Jan. 1994).
WPIDS Abstract No. 97:356819 which is an abstract of Japanese Patent Specification No. 09–148590 (Jun. 1997).
Tabata et al., "Anistropic Etching Of Silicon In TMAH Solutions", Sensors and Actuators A 34 (1992), pp. 51–57.
L. Zimmermann et al., "Airbag Application: a Microsystem Including a Silicon Capacitive Accelerometer, CMOS Switched Capacitor Electronics and True Self–test Capability", Sensors and Actuators A 46–47, 1995, pp. 190–195 No Month.
G. Andersson, "A Novel 3–Axis Monolithic Silicon Accelerometer", Extended Abstract Transducers, Ref. No. 114, pp. 1–4 (1995) No Month.

*Primary Examiner*—Anthony Green
*Attorney, Agent, or Firm*—Kenneth M. Seddon; Daniel R. Collopy

[57] ABSTRACT

Trench structures (12,32,35,46) are formed in single crystal silicon substrates (10,30) that have either a (110) or (112) orientation. A selective wet etch solution is used that removes only the exposed portions of the single crystal silicon substrates (10,30) that are in the (110) or (112) crystal planes. The trench structures (12,32,35,46) are defined by the {111} crystal planes in the single crystal silicon substrate (10,30) that are exposed during the selective wet etch process. Trench structures (32,35) can be formed on both sides of a single crystal silicon substrate (30) to form an opening (34). Opening (34) can be used as an alignment mark to align front side processing to backside and vice versa. Trench structures can also be use to form a microstructure (41,61) for a sensor (40,60).

22 Claims, 4 Drawing Sheets

METHOD OF ETCHING A TRENCH INTO A SEMICONDUCTOR SUBSTRATE

BACKGROUND OF THE INVENTION

This invention relates, in general, to methods of fabricating semiconductor devices, and more particularly, to methods for etching semiconductor substrates.

There has been an ongoing effort to produce semiconductor devices with improved performance and functionality. In some cases, the improvement in performance is achieved by developing sophisticated semiconductor device structures, which is accomplished with a complex processing sequence. Traditionally, all semiconductor devices have been formed on only one side of a semiconductor substrate. However, many sophisticated semiconductor structures now require that processing occur on both sides of the semiconductor substrate.

A manufacturing flow which processes both sides of a semiconductor substrate requires that the process steps occurring on one side be accurately aligned to the process steps occurring on the opposite side. Up to now, this alignment has been provided by aligning the flat or flats of a semiconductor substrate to a known orientation. This traditional method, however, is not sufficient for aligning a semiconductor substrate on wafers with large diameters when sub-micron device structures are fabricated by processing both sides of the semiconductor substrate.

Accordingly, it should be appreciated that it would be advantageous to provide a method of forming structures in a semiconductor substrate such that the structures can be used to accurately align the substrate. It would also be advantageous if the method could be used to form other semiconductor device structures.

DETAILED DESCRIPTION OF THE DRAWINGS

Semiconductor substrates are typically made from single crystal substrates which have a particular crystal lattice orientation. The orientation of the crystalline substrate is generally referred to by the orientation of the top surface of the substrate. For example, most silicon substrates are either (100) or (111) orientation. This means that the top surface is perpendicular with either the <100> or <111> direction respectively. Most semiconductor devices are fabricated using substrates that have a (100) or (111) orientation because of the improvement seen in the transistors formed in such substrates. Substrates of (100) or (111) orientation generally have reduced parasitic parameters which improve the performance of the transistors. This is why most of the past research and development efforts have been directed towards substrates that have a (100) or (111) crystal plane orientation.

Although these substrates produce transistors with improved performance, their orientation makes some processing steps more difficult. For example, it is not possible to form vertical and parallel trench structures using wet etch processes that are selective to particular crystal planes. As a result, vertical trench structures are formed using a time consuming isotropic etch such as a reactive ion etch (RIE) process.

Figure 1:
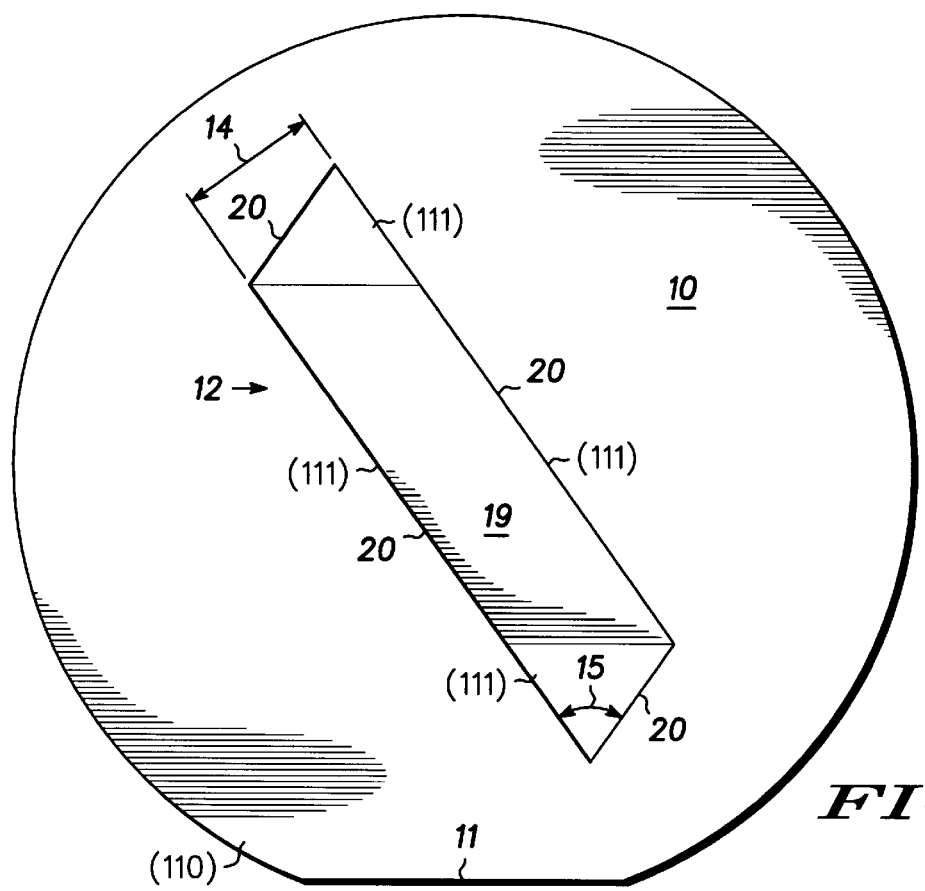
FIG. 1 is a top view of a first embodiment of the present invention showing an enlarged trench structure in a semiconductor substrate.

The first embodiment of the present invention, however, is directed to forming trench structures in a semiconductor substrate such as silicon or germanium substrates with a (110), (112), or similar crystal lattice orientation. Turning to FIG. 1 for a better understanding of present invention, a trench structure 12 is formed in a single crystal silicon substrate 10. The size of trench structure 12 relative to that of single crystal silicon substrate 10 is enlarged for the purpose of showing the orientation of the crystal planes in single crystal silicon substrate 10. It should be appreciated that the size of actual trench structures can be adjusted according to the requirements of the semiconductor devices formed in conjunction with trench structure 12. Trench structure 12 can have a variety of applications in semiconductor devices including, but not limited to, electrical isolation structures, alignment marks, and microstructures. The use of trench structure 12 in each of these applications will follow, but first a description of a method to form trench structure 12 will be provided.

As shown in FIG. 1, the top surface of single crystal silicon substrate 10 is in a (110) crystal plane. Trench structure 12 is defined by edges in the top surface of single crystal silicon substrate 10, which are at an angle of about 70.53°, shown in FIG. 1 as angle 15. This is due to the intersection of (111) planes 20 at the surface. The width of trench structure 12, shown as width 14, is defined by two parallel {111} planes. The bottom 19 of trench structure 12 is in the (110) crystal plane and is essentially parallel with the top surface of single crystal silicon substrate 10. As shown in FIG. 1, single crystal silicon substrate 10 can also have a flat 11 cut along a (100) or (111) crystal plane which is used to align single crystal silicon substrate 10 to semiconductor processing equipment.

Figure 2:
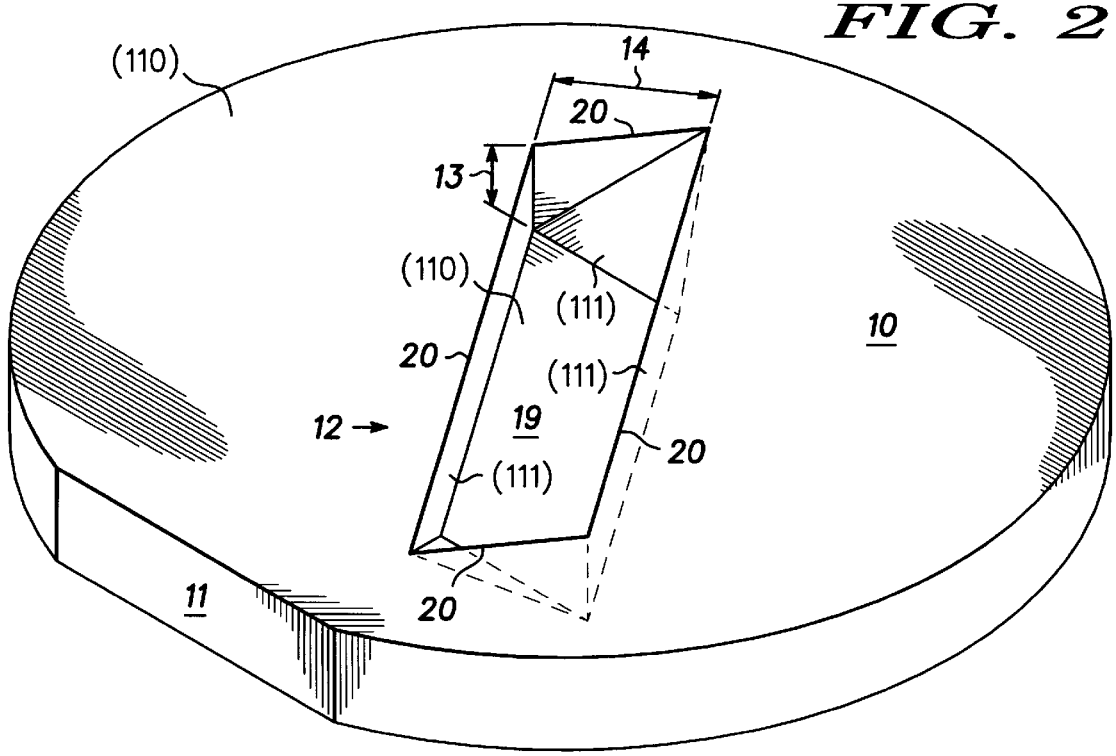
FIG. 2 is an isometric view of the enlarged trench structure.

Moving now to FIG. 2, trench structure 12 is shown in an isometric view to demonstrate how trench structure 12 is further defined by intersecting {111} planes 20 and the (110) plane which is the bottom 19 of trench structure 12. The depth of trench structure 12, shown as depth 13, is defined as the distance between the top surface of single crystal silicon substrate 10 and the bottom 19.

To form trench structure 12, a selective wet etch, preferably tetramethylammoniumhydroxide (TMAH), is used which only removes the exposed portions of single crystal silicon substrate 10 that are in the (110) plane. As this selective wet etch proceeds, the wet etch will expose any planes having a (111) orientation which serve to define trench structure 12. A description of how a solution comprising TMAH, or the like, can be used to selectively etch particular crystal planes is presented in U.S. Pat. No. 5,207,866, which issued to Lue et al. on May 4, 1993, and is hereby incorporated by reference.

Figure 3:
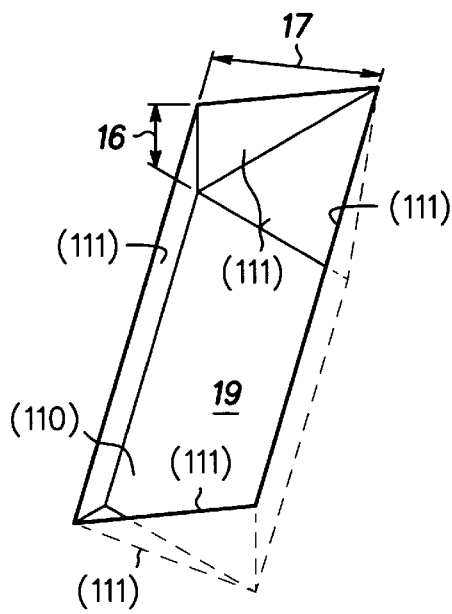
FIG. 3 is an enlarged isometric view of a trench structure at the early stage of fabrication.
Figure 4:
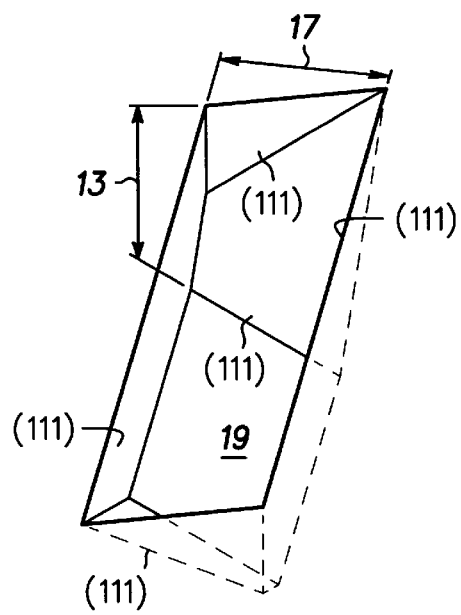
FIG. 4 is an enlarged isometric view of the trench structure after additional processing.

FIGS. 3 and 4 are provided to demonstrate how the above mentioned selective wet etch proceeds to form trench structure 12. Simply stated, FIGS. 3 and 4 represent the shape of trench structure 12 at two different points during the etch process. More details on the actual etch process will be described later. For now it is sufficient to simply understand how the general shape of trench structure 12 is defined. FIG. 3 is an enlarged isometric view of trench structure 12 near the beginning of the wet etch process. Trench structure 12 has a width and depth shown as width 17 and depth 16. Depth 16 is the distance from the top surface to the bottom 19 of trench structure 12. Also shown in FIG. 3 are the {111} crystal planes which define the boundaries of trench structure 12. With the exception of bottom 19, which is in the (110) plane, all the surfaces shown in FIG. 3 are in the {111} planes.

FIG. 4 is an enlarged isometric view of trench structure 12 after additional selective wet etching. Note that the width of trench structure 12, width 17, has not changed between FIG. 3 and FIG. 4, but the depth, now shown as depth 13, has increased. As the wet etch proceeds, only the portion of bottom 19 that is in the (110) plane is removed so the {111} crystal planes are uncovered. As shown in FIG. 3 and FIG. 4, the surface area of bottom 19 decreases as the wet etch proceeds. The wet etch will proceed until there is no remaining exposed (110) crystal planes.

Turning back to trench 12 as shown in FIG. 2, a more detailed method for forming trench structure 12 will be provided. First a masking layer (not shown) is formed on single crystal silicon substrate 10. The masking layer can comprise a variety of materials such as silicon dioxide, silicon nitride, photoresist, or any material that can protect single crystal silicon substrate 10 from the selective wet etch to follow. After formation of the masking layer, openings are formed in the masking layer to expose the portions of single crystal silicon substrate 10 that are to be etched. For example, if the masking layer comprises silicon dioxide, a layer of photoresist (not shown) can be patterned on the masking layer and then a reactive ion etch (RIE) or wet etch can be used to remove the exposed portions of the masking layer and expose the underlying portion of single crystal silicon substrate 10. Preferably, TMAH is used to perform the selective wet etch. However, solutions comprising cesium hydroxide, ethylenediamine pyrocatechol (EDP), potassium hydroxide, lithium hydroxide, sodium hydroxide or any OH—ion generating chemical could also be used.

Figure 5:
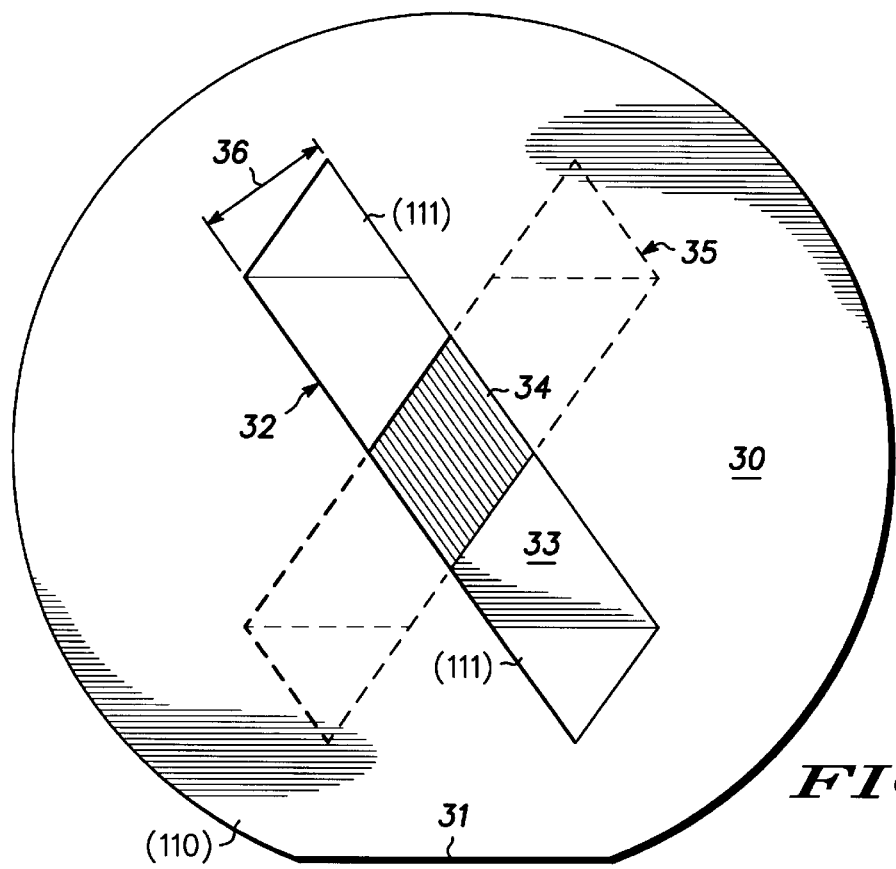
FIG. 5 is a top view of a second embodiment of the present invention showing an enlarged trench structure and an opening formed by the trench.

Turning now to FIG. 5, a second embodiment of the present invention will be provided. As alluded to earlier, the present invention can also be used to form alignment marks by forming openings 34 that pass completely through single crystal silicon substrate 30. In the second embodiment, a first trench structure 32 is formed on the top surface of single crystal silicon substrate 30, and a second trench structure 35, shown in FIG. 5 with dashed lines, is formed on the backside of single crystal silicon substrate 30. If trench structures 32 and 35 are formed such that they intersect with each other, an opening 34 will be created at the bottom 33 of first trench structure 32. Opening 34 corresponds to the portions of first trench structure 32 and second trench structure 35 that overlap with each other. Opening 34 can have a variety of uses in semiconductor device structures and processing such as use as an alignment mark to ensure that the processing that occurs on the top side of a single crystal silicon substrate 30 is accurately aligned to any processing that occurs on the backside of single crystal silicon substrate 30. Since the size of opening 34 is only limited by the photolithographic techniques which define trench structures 32 and 35, opening 34 can be used to provide accurate alignment in sub-micron processing. The width 36 of trench structures 32 and 35 can be about 0.1 microns to 100 microns. Single crystal silicon substrate 30 can also have a flat 31 which is used by processing equipment to align the orientation of single crystal silicon substrate 30. It should also be understood that a plurality of openings 34 can be made in single crystal silicon substrate 30 to be used in the alignment process.

Figure 6:
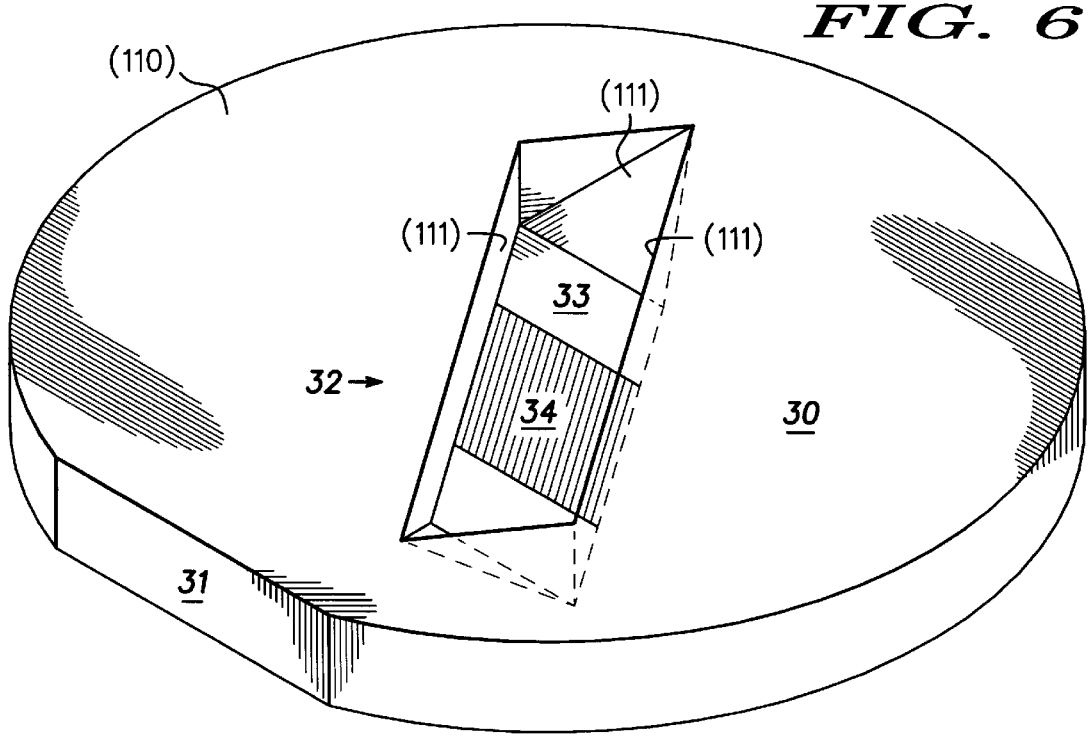
FIG. 6 is an isometric view of the enlarged trench structure and the opening.

FIG. 6 is an enlarged isometric view showing first trench structure 32 and opening 34. Since second trench structure 35 is formed on the backside of single crystal silicon substrate 30, it is not shown in FIG. 6. Again, the sides of first trench structure 32 are defined by crystal planes that have a (111) lattice orientation. The bottom 33 of first trench structure 32 is in the (110) crystal plane and is removed by a selective wet etch. Opening 34 is on the bottom 33 of first trench structure 32 and occurs where first trench structure 32 and second trench structure 35 intersect. To form opening 34, the above mentioned method of forming trench structure 12 of FIG. 2 is replicated such that trenches 32 and 35 are formed on opposite sides of single crystal silicon substrate 30.

In contrast to the method of forming opening 34 as described above, some previously known methods for forming openings have relied on using a RIE etch which slowly burrows through a wafer. Most RIE equipment is a single wafer process, so the throughput of this operation is rather slow. RIE etches also have the limitation in that, as the RIE etch proceeds, residue builds on the side-walls and bottom of the trench. As an result, the minimum size of the opening is limited to about 1 micron. The present invention, however, provides a process that can be used to form sub-micron openings, even as small as 0.1 microns. The present invention also has the added advantage in that the selective wet etch can be performed as a batch process. Since many wafers can be processed simultaneously, the throughput is dramatically improved over a single wafer RIE process.

Figure 7:
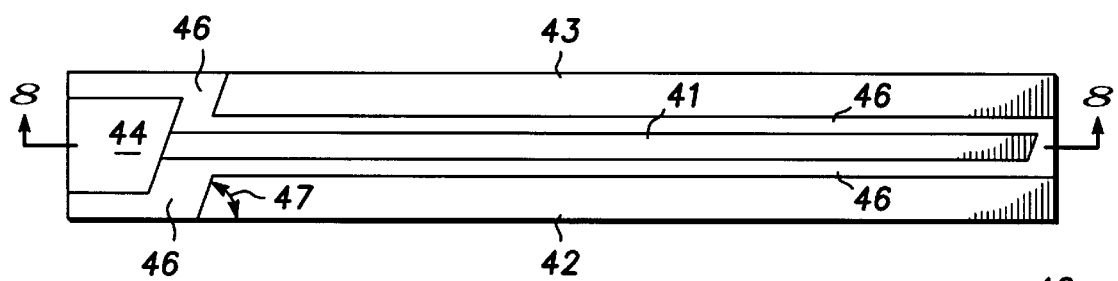
FIG. 7 is an enlarged top view of a sensor according to a third embodiment of the present invention.
Figure 8:
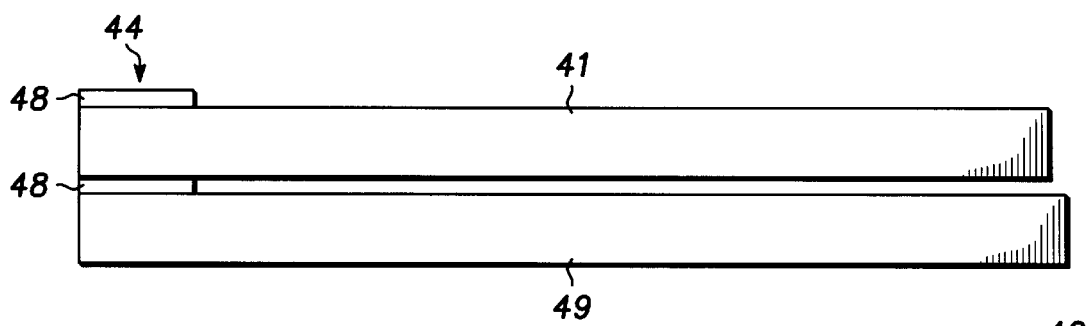
FIG. 8 is an enlarged cross-sectional view of the sensor of FIG. 7.

The present invention can also be used to form the microstructure of sensor devices, such as an accelerometer. Because of the selective nature of forming the trench structures in the present invention, the trench structures can be used to form microstructures as part of a micromachined sensor. Turning now to FIGS. 7 and 8, a third embodiment of the present invention will be provided. In FIG. 7, sensor 40 comprises a microstructure 41 that is attached to a base 44 and whose motion can be detected by electrodes 42 and 43. To form sensor 40, microstructure 41 is carved out of a single crystal silicon substrate (not shown) that has either a (110) or a (112) crystal lattice orientation. The only portions of the single crystal silicon substrate that remain in FIGS. 7 and 8 are the portions that become microstructure 41, electrodes 42 and 43, and base 44.

First trench structures 46 are formed on both sides of the single crystal silicon substrate by patterning a masking layer 48 on the top side and bottom side of the single crystal silicon substrate. Trench structures 46 are used to carve and define the elements of sensor 40 out of the single crystal silicon substrate. Preferably, masking layer 48 is a layer comprising silicon dioxide which is grown thermal oxide or deposited using a low temperature chemical vapor deposition (LPCVD) on both sides of the single crystal silicon substrate.

A photoresist layer (not shown) is then used to expose portions of masking layer 48 on the top side of the single crystal silicon substrate. An additional layer of photoresist (not shown) is then patterned on the back side of the single crystal silicon substrate to expose portions of masking layer 48 that define microstructure 41. A wet etch solution comprising hydrofluoric acid is then used to remove the exposed portions of masking layer 48 from both the top and bottom sides.

A selective wet etch, comprising an etchant such as TMAH, is then used to remove the exposed portions of the single crystal silicon substrate so that trench structures 46 are formed on both the top side and bottom side of the single crystal silicon substrate. The wet etch step is stopped once the depth of trench structures 46 is approximately 25 percent of the thickness of the single crystal silicon substrate. It is important that the etch does not proceed so that trench structures 46 from the top side intersect with trench structures 46 from the bottom side. This would cause microstructure 41 to prematurely release and damage sensor 40. A dry etch or a wet etch solution of sulfuric acid is then used to remove the layers of photoresist.

A handle wafer or substrate 49 is then bonded to the single crystal silicon substrate to provide structural support to sensor 40. This is necessary since the bulk of the single crystal silicon substrate is removed with the wet etch process. Most bonding processes used by those skilled in the art are sufficient to attach substrate 49 onto sensor 40. Note that the portion of masking layer 48 that remains on the back side of base 44 will provide separation between microstructure 41 and substrate 49 so microstructure 41 is free to move.

After bonding, an additional selective wet etch is performed so that trench structures 46 from the top side of the single crystal silicon substrate intersect trench structures 46 formed on the back side of the single crystal silicon substrate. This will release microstructure 41 from the single crystal silicon substrate so that microstructure 41 is attached at base 44 and is free to move in a direction essentially perpendicular to electrodes 43 and 42. If desired, masking layer 48 can be removed from the top side of microstructure 41 using an etch process. It should be noted that the edges of trench structures 46, electrodes 42 and 43, and base 44 are formed by intersecting {111} planes. The typical angle at the intersection of these planes is about 70.53° as shown by angle 47.

The present invention forms a sensor 40 with a process that offers significant advantages over previously known methods for forming sensors. Traditional sensor structures form a microstructure from a polysilicon layer that is deposited over a sacrificial layer or substrate. Microstructures formed from a polysilicon layer have the drawback that their mechanical and physical properties, such as resistivity and thermal expansion, can vary greatly due the grain boundaries in the polysilicon layer. Microstructures formed from polysilicon also require the additional processing necessary to deposit, protect, and form the polysilicon layer. In the present invention, however, microstructure 41 is formed from single crystal silicon which has a very predictable and controllable mechanical properties. The present invention also obviates the need for the deposition of a polysilicon layer, which in turn reduces the manufacturing cost of sensor 40.

Figure 9:
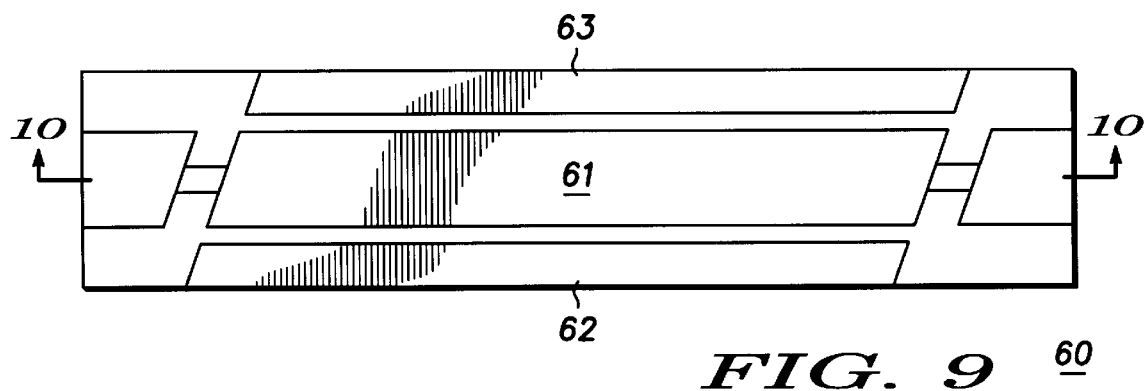
FIG. 9 is an enlarged top view of a sensor according to a fourth embodiment of the present invention.
Figure 10:
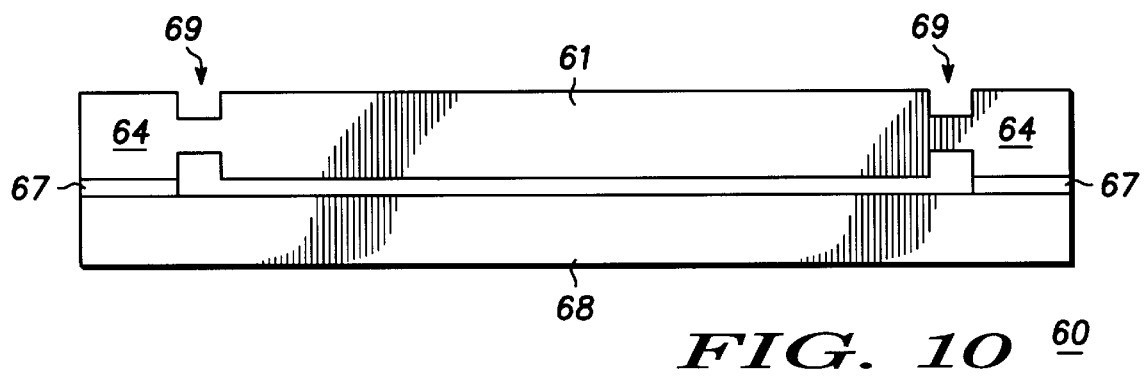
FIG. 10 is an enlarged cross-sectional view of the sensor of FIG. 9.

Turning now to FIGS. 9 and 10, an alternate configuration of a sensor according to the present invention will be provided. The response a microstructure has to an external acceleration force is predominately determined by its width, length, and the thickness of the single crystal silicon substrate from which the microstructure is formed. In some applications it may be necessary to adjust the sensitivity of the microstructure by adjusting the mass ratio across its length. A method for changing the sensitivity of a microstructure is shown in FIG. 9 and FIG. 10. FIG. 9 and FIG. 10 show a sensor 60 comprising a microstructure 61 that can move between two electrodes 62 and 63. Sensor 60 is supported at bases 64 by a handle wafer 68 and microstructure 61 is separated from handle wafer 68 by remaining portions of a masking layer 67.

Sensor 60 is formed using a similar process used to form sensor 40 shown in FIGS. 7 and 8. Additional process steps are performed to remove portions of microstructure 61 near base 64 to form hinges 69. Hinges 69 are formed by an additional photoresist layer (not shown) which is used to expose masking layer 67 near bases 64. The exposed portions of masking layer 67 are then removed and the underlying portions of the single crystal silicon substrate are removed using the same selective wet etch process used to define microstructure 61. It should be understood that the location, width, depth, and number of hinges 69 can be adjusted to control the mass distribution and spring constant of microstructure 61.

As described above, microstructures 41 and 61 can be used to detect motion in one direction which is perpendicular to electrodes 42 and 43 or 62 and 63. It should also be understood that a second sensor (not shown) can be formed that it along another (111) crystal plane and at an angle of 70.53° to sensor 40 or 60. This second sensor can be used to detect acceleration forces in two directions, i.e. in both the x and y direction.

By now it should be appreciated that the present invention provides a method of etching trench structures into a single crystal silicon substrate. Because of the special properties and orientations of (110) and (112) silicon substrates, trench structures of unlimited depth can be formed. This method allows narrow and vertical trenches to be formed as a batch process in a wet etch solution which has improved throughput and cost savings versus a single wafer RIE process.

We claim:

1. A method for etching a semiconductor substrate, the method comprising the steps of:

providing a semiconductor substrate having a top surface and a bottom surface, wherein the top surface is of a (110) crystal plane orientation;

disposing a masking layer overlying the top surface of the semiconductor substrate;

removing a portion of the masking layer to provide an exposed portion of the top surface, the exposed portion of the top surface having a width; and etching the exposed portion of the top surface of the semiconductor substrate along a <110> direction thereby forming a trench, the trench extending from the top surface and comprising two parallel planes along a <111> direction.

2. The method of claim 1 wherein the width of the trench extending from the top surface is about 0.1 microns to 100 microns.

3. The method of claim 1 further comprising the steps of:

disposing a masking layer on the bottom surface of the semiconductor substrate;

removing a portion of the masking layer on the bottom surface to provide an exposed portion of the bottom surface, the exposed portion of the bottom surface having a width; and etching the semiconductor substrate from the bottom surface along the <110> direction such that a trench is formed, the second trench extending from the bottom surface and comprising two parallel planes along a <111> direction.

4. The method of claim 3 wherein the step of etching the semiconductor substrate continues until the trench extending from the bottom surface intersects the trench extending from the top surface to provide an opening through the semiconductor substrate.

5. The method of claim 4 wherein the step of disposing the masking layer on the bottom surface occurs simultaneously with disposing the masking layer overlying the top surface of the semiconductor substrate.

6. The method of claim 1 wherein the step of providing the semiconductor substrate includes providing a single crystal silicon substrate having a flat along a <111> direction.

7. The method of claim 1 wherein the step of disposing the masking layer overlying the top surface of the semiconductor substrate includes disposing a material selected from the group consisting of silicon, oxide, nitride, silicon dioxide, and photoresist.

8. The method of claim 1 wherein the step of etching the semiconductor substrate uses a solution comprising a chemical selected from the group consisting of cesium hydroxide, tetramethylammoniumhydroxide, potassium hydroxide, ethylenediamine pyrocatechol, lithium hydroxide, and sodium hydroxide.

9. A method for forming a semiconductor device, the method comprising the steps of:
providing a single crystal silicon substrate having a top surface and a bottom surface, wherein the single crystal silicon substrate is of a (110) crystal plane orientation;
forming a masking layer on the top surface and the bottom surface of the single crystal silicon substrate;
patterning the masking layer to provide an exposed portion of the top surface and an exposed portion of the bottom surface of the single crystal silicon substrate;
etching the single crystal silicon substrate from the top surface and the bottom surface along a <110> direction such that (111) crystal planes of the single crystal silicon substrate are exposed so that a trench is formed on both the top surface and the bottom surface of the single crystal silicon substrate, the trench on the top surface and the trench on the bottom surface comprising parallel planes along a <111> direction;
bonding a substrate to the single crystal silicon substrate; and
etching the single crystal silicon substrate from the top surface along the <110> direction such that (111) crystal planes of the single crystal silicon substrate are exposed so that the trench from the top surface intersects the trench on the bottom surface to provide a microstructure.

10. The method of claim 9 wherein the step of providing the single crystal silicon substrate includes providing a single crystal silicon substrate having a flat along a <111> direction.

11. The method of claim 9 wherein the step of forming the masking layer includes forming a masking layer comprising a material selected from the group consisting of silicon, silicon dioxide, oxide, nitride, or photoresist.

12. The method of claim 9 wherein the step of patterning the masking layer comprises the steps of:
depositing a layer of photoresist onto the masking layer;
patterning the layer of photoresist to expose a portion of the masking layer; and
etching the portion of the masking layer.

13. The method of claim 9 wherein the step of etching the single crystal silicon substrate uses a solution comprising a chemical selected from the group consisting of tetramethylammoniumhydroxide, cesium hydroxide, potassium hydroxide, ethylenediamine pyrocatechol, lithium hydroxide, and sodium hydroxide.

14. The method of claim 9 further comprising the steps of:
patterning the masking layer to provide an exposed portion of the microstructure; and
etching the exposed portion of the microstructure to form a hinge.

15. The method of claim 14 wherein the step of etching the exposed portion of the microstructure forms a hinge on the top surface of the single crystal silicon substrate at an angle of about 70.53° with the microstructure.

16. The method of claim 9 further comprising the step of forming an additional trench structure in the top surface of the single crystal silicon substrate at an angle of about 70.53° to the microstructure of the semiconductor device.

17. A method for etching a semiconductor substrate, the method comprising the steps of:
providing a single crystal silicon substrate having a top surface and a bottom surface, wherein the top surface is of a (112) crystal plane orientation;
disposing a masking layer on the top surface of the single crystal silicon substrate;
removing a portion of the masking layer to provide an exposed portion of the top surface, the exposed portion of the top surface having a width; and
etching the single crystal silicon substrate from the top surface along a <112> direction such that (111) crystal planes of the single crystal silicon substrate are exposed so that a trench extending from the top surface is formed, the trench comprising two parallel planes along a <111> direction and separated by a distance.

18. The method of claim 17 wherein the width of the trench extending from the top surface is about 0.1 microns to 100 microns.

19. The method of claim 17 further comprising the steps of:
disposing a masking layer on the bottom surface of single crystal silicon substrate;
removing a portion of the masking layer on the bottom surface to provide an exposed portion of the bottom surface; and
etching the single crystal silicon substrate from the bottom surface along the <112> direction such that (111) crystal planes of the single crystal silicon substrate are exposed so that a trench extending from the bottom surface is formed, the trench extending from the bottom surface and comprising two parallel planes along a <111> direction.

20. The method of claim 19 wherein the step of etching the single crystal silicon substrate continues until the trench extending from the bottom surface intersects the trench extending from the top surface to provide an opening through the single crystal silicon substrate.

21. The method of claim 19 wherein the step of disposing the masking layer on the top surface of the single crystal silicon substrate includes disposing a masking layer comprising a material selected from the group consisting of silicon, oxide, nitride, and photoresist.

22. The method of claim 19 wherein the step of etching the single crystal silicon substrate uses a solution comprising a chemical selected from the group consisting of cesium hydroxide, tetramethylammoniumhydroxide, potassium hydroxide, ethylenediamine pyrocatechol, lithium hydroxide, and sodium hydroxide.

* * * * *